(12) United States Patent
Sakashita et al.

(10) Patent No.: US 9,240,769 B2
(45) Date of Patent: Jan. 19, 2016

(54) PIEZOELECTRIC THIN FILM RESONATOR, FILTER, COMMUNICATION MODULE AND COMMUNICATION DEVICE

(75) Inventors: Takeshi Sakashita, Tokyo (JP); Motoaki Hara, Miyagi (JP); Masafumi Iwaki, Tokyo (JP); Tsuyoshi Yokoyama, Tokyo (JP); Shinji Taniguchi, Tokyo (JP); Tokihiro Nishihara, Tokyo (JP); Masanori Ueda, Tokyo (JP)

(73) Assignee: TAIYO YUDEN CO., LTD., Tokyo (JP)

( * ) Notice: Subject to any disclaimer, the term of this patent is extended or adjusted under 35 U.S.C. 154(b) by 674 days.

(21) Appl. No.: 13/528,445

(22) Filed: Jun. 20, 2012

(65) Prior Publication Data

US 2012/0256706 A1   Oct. 11, 2012

Related U.S. Application Data

(62) Division of application No. 12/627,412, filed on Nov. 30, 2009, now Pat. No. 8,240,015.

(30) Foreign Application Priority Data

Mar. 19, 2009   (JP) .................................. 2009-068019

(51) Int. Cl.
*H01L 41/047* (2006.01)
*H03H 9/17* (2006.01)
*H03H 3/02* (2006.01)
*H03H 9/02* (2006.01)
*H03H 9/13* (2006.01)
(Continued)

(52) U.S. Cl.
CPC ................. *H03H 9/174* (2013.01); *H03H 3/02* (2013.01); *H03H 9/02118* (2013.01); *H03H 9/132* (2013.01); *H03H 9/173* (2013.01); *H03H 9/605* (2013.01); *H03H 9/706* (2013.01); *Y10T 29/42* (2015.01); *Y10T 29/49155* (2015.01); *Y10T 29/49156* (2015.01)

(58) Field of Classification Search
USPC .......................... 310/320, 348–353, 363–366
See application file for complete search history.

(56) References Cited

U.S. PATENT DOCUMENTS 2,483,677 A * 10/1949 Swinehart ..................... 310/340
3,167,668 A *  1/1965 Nesh ............................. 310/340
(Continued)

FOREIGN PATENT DOCUMENTS

CN       1610254 A    4/2005
CN    101061634 A   10/2007
(Continued)

OTHER PUBLICATIONS

Chinese Office Action dated Jun. 20, 2012 in a counterpart Chinese patent application No. 200910261058.0.
(Continued)

*Primary Examiner* — Thomas Dougherty
(74) *Attorney, Agent, or Firm* — Chen Yoshimura LLP

(57) ABSTRACT

A piezoelectric thin film resonator includes a substrate, a lower electrode provided on the substrate, a piezoelectric film provided on the lower electrode, and an upper electrode provided on the piezoelectric film. At least a portion of the upper electrode and that of the lower electrode oppose each other through the piezoelectric film, and at least a portion of the periphery of the upper electrode is reversely tapered.

16 Claims, 13 Drawing Sheets

(51) Int. Cl.
*H03H 9/60* (2006.01)
*H03H 9/70* (2006.01)

(56) References Cited

U.S. PATENT DOCUMENTS

| | | | |
|---|---|---|---|
| 6,867,667 B2 | 3/2005 | Takeuchi et al. | |
| 7,098,758 B2 | 8/2006 | Wang et al. | |
| 8,546,998 B2 * | 10/2013 | Weston | 310/328 |
| 2005/0099094 A1 | 5/2005 | Nishihara et al. | |
| 2006/0091764 A1 | 5/2006 | Tsutsumi et al. | |
| 2006/0152110 A1 | 7/2006 | Taniguchi et al. | |
| 2006/0231288 A1 | 10/2006 | Vanfleteren et al. | |
| 2007/0046157 A1 * | 3/2007 | Onishi et al. | 310/365 |
| 2007/0252476 A1 | 11/2007 | Iwaki et al. | |
| 2007/0279154 A1 | 12/2007 | Taniguchi et al. | |
| 2009/0033177 A1 | 2/2009 | Itaya et al. | |
| 2010/0237750 A1 | 9/2010 | Sakashita et al. | |

FOREIGN PATENT DOCUMENTS

| | | | |
|---|---|---|---|
| EP | 1850478 A2 | 10/2007 | |
| JP | 59-023612 A | 2/1984 | |
| JP | 2006-128993 A | 5/2006 | |
| JP | 2007-300430 A | 11/2007 | |
| JP | 2007-324823 A | 12/2007 | |
| JP | 2010-130294 A | 6/2010 | |
| KR | 2007-0105943 A | 10/2007 | |
| WO | 2007/017974 A1 | 2/2007 | |

OTHER PUBLICATIONS

U.S. Appl. No. 12/627,412, filed Nov. 30, 2009.

Korean Office Action in a counterpart application No. 10-2009-0127064 of the parent U.S. Appl. No. 12/627,412, dated Mar. 28, 2011.

Japanese Office Action in a counterpart Japanese application No. 2009-068019 of the parent U.S. Appl. No. 12/627,412, dated Jul. 21, 2011.

Korean Office Action in a counterpart application No. 10-2009-0127064 of the parent U.S. Appl. No. 12/627,412, dated Dec. 27, 2011.

* cited by examiner

PIEZOELECTRIC THIN FILM RESONATOR, FILTER, COMMUNICATION MODULE AND COMMUNICATION DEVICE

CROSS-REFERENCE TO RELATED APPLICATION

This application is a divisional of a pending application, U.S. Ser. No. 12/627,412 filed on Nov. 30, 2009, which is hereby incorporated by reference in its entirety. The parent application is based upon and claims the benefit of priority of the prior Japanese Patent Application No. 2009-68019 filed on Mar. 19, 2009, the entire contents of which is incorporated herein by reference.

FIELD

The disclosure of the present application relates to piezoelectric thin film resonators. The disclosure of the present application relates to filters, communication modules and communication devices including the piezoelectric thin film resonators.

BACKGROUND

In recent years, SAW (surface acoustic wave) filters and BAW (bulk acoustic wave) filters have been used widely for RF filters for mobile communications such as for mobile phones. BAW filters include piezoelectric thin film resonators. There are two types of piezoelectric thin film resonators: FBAR (Film Bulk Acoustic Resonator) and SMR (Solidly Mounted Resonator). An FBAR has a structure in which an upper electrode, a piezoelectric film and a lower electrode are provided on a substrate as main components, and an air gap is formed under the lower electrode at a portion where the upper electrode and the lower electrode oppose each other. Here, the air gap is formed by wet etching a sacrificial layer provided on the surface of or inside the substrate, or wet etching or dry etching the substrate from the backside. On the other hand, an SMR has a structure in which, instead of the air gap, a laminate with a film thickness of $\lambda/4$ ($\lambda$: wavelength of acoustic wave) formed by alternately laminating films having a high acoustic impedance and films having a low acoustic impedance is provided, and the laminate is utilized as an acoustic reflection film.

In particular, filters and branching filters using BAWs have been receiving attention due to their higher Q-value even at high frequencies and smaller losses than those using conventional SAWs. However, as demands for lower power consumption in the field of mobile communications have become vigorous in recent years, the filters and the branching filters using BAWs are demanded for a further reduction in losses. Because of these reasons, low-loss piezoelectric thin film resonators have been actively developed.

One of the factors that contributes to losses in such filters using BAWs is that acoustic waves leak to the outside (hereinafter referred to as a non-resonance portion) of an area where the upper electrode and the lower electrode oppose each other (hereinafter referred to as a resonance portion), in other words, acoustic waves leak into an area where they are less likely to be reconverted into electric signals, and thereby causing losses. Herein, this phenomenon will be referred to as a "lateral leakage". The lateral leakage is caused by the magnitude relationship in acoustic velocity between the resonance portion and the non-resonance portion. The magnitude relationship in acoustic velocity that suppresses the lateral leakage is determined by the Poisson's ratio of a piezoelectric material to be used. The acoustic velocity in the resonance portion becomes lower than that in the non-resonance portion when the Poisson's ratio is 1/3 or more, and the acoustic velocity in the resonance portion becomes higher than that in the non-resonance portion when the Poisson's ratio is 1/3 or less.

Here, in a case where a piezoelectric film is formed using a material whose Poisson's ratio is 1/3 or more, the acoustic velocity in the resonance portion becomes lower than that in the periphery when an appropriate amount of mass is added to the resonance portion. Thus, the lateral leakage can be suppressed with relative ease. In contrast, in a case where a piezoelectric film is formed using a material whose Poisson's ratio is 1/3 or less, the acoustic velocity relationship that suppresses the lateral leakage becomes opposite. Thus, it is difficult to suppress the lateral leakage. In currently-practical filters using piezoelectric thin film resonators, AlN, whose Poisson's ratio is 1/3 or less, is used for the piezoelectric films. Thus, it is difficult to suppress the lateral leakage, and as a result the losses increase.

As a way to solve the lateral leakage of acoustic waves, Japanese Laid-open Patent Application No. 2007-300430 discloses a resonator in which the piezoelectric film in the resonance portion is subjected to patterning and at least a portion of the periphery of the patterned piezoelectric film is provided inwardly than an area where the upper electrode and the lower electrode oppose each other. By using the resonator disclosed in Japanese Laid-open Patent Application No. 2007-300430, the lateral leakage of acoustic waves can be suppressed in a highly effective manner.

The Q-value of the resonator disclosed in the patent document can be increased by increasing the over-etching amount of the piezoelectric film to further increase the length of a hood-like end portion. When the length of the hood-like end portion is increased, the mechanical strength of the end portion is difficult to maintain. Accordingly, with the resonator disclosed in the patent document, it is difficult to increase the Q-value while maintaining the mechanical strength of the end portion.

SUMMARY

According to an aspect of the invention, a piezoelectric thin film resonator includes: a substrate; a lower electrode provided on the substrate; a piezoelectric film provided on the lower substrate; and an upper electrode provided on the piezoelectric film. At least a portion of the upper electrode and that of the lower electrode oppose each other through the piezoelectric film, and at least a portion of a periphery of the upper electrode has a reversely tapered shape.

Additional objects and advantages of the invention (embodiment) will be set forth in part in the description which follows, and in part will be obvious from the description, or may be learned by practice of the invention. The object and advantages of the invention will be realized and attained by means of the elements and combinations particularly pointed out in the appended claims. It is to be understood that both the foregoing general description and the following detailed description are exemplary and explanatory only and are not restrictive of the invention, as claimed.

DESCRIPTION OF EMBODIMENT(S)

According to an aspect of the invention, the periphery of the upper electrode is placed so as to coincide with or to be in the vicinity of at least a portion of a periphery of the piezoelectric film. By configuring the piezoelectric thin film resonator in this way the lateral leakage of acoustic waves can be reduced while maintaining the mechanical strength of the periphery of the upper electrode and the Q-value can be increased.

According to an aspect of the invention, an area where the upper electrode and the lower electrode oppose each other has an elliptic shape. By configuring the piezoelectric thin film resonator in this way, it is possible to suppress the occurrence of a standing wave in the area where the upper electrode and the lower electrode oppose each other. Thus, the occurrence of a ripple in the communication band can be suppressed.

According to an aspect of the invention, an area where the upper electrode and the lower electrode oppose each other has a polygonal shape that does not include two parallel sides. By configuring the piezoelectric thin film resonator in this way, it is possible to suppress the occurrence of a standing wave in the area where the upper electrode and the lower electrode oppose each other. Thus, the occurrence of a ripple in the communication band can be suppressed.

Embodiments

1. Configuration of Piezoelectric Thin Film Resonator

Figure 1A:
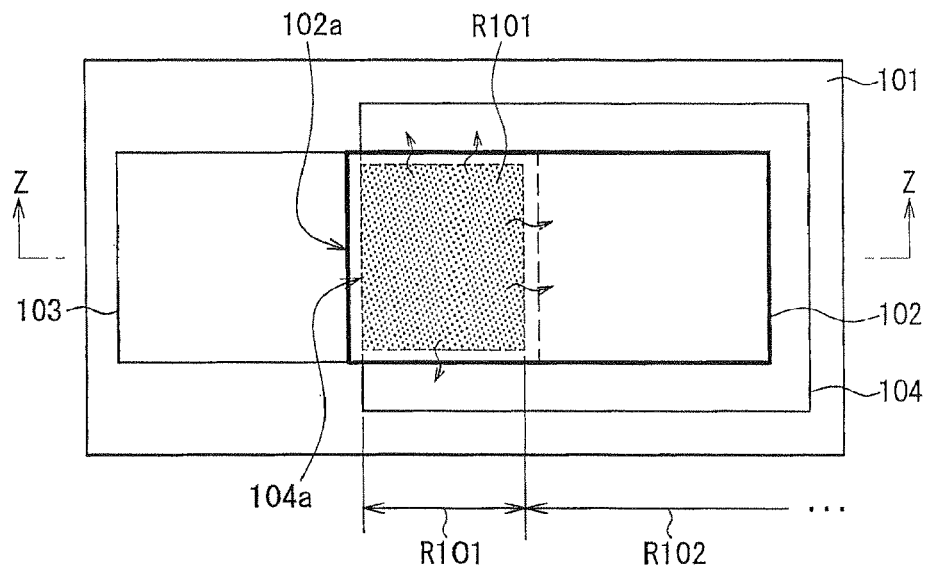
FIG. 1A is a plan view illustrating a conventional piezoelectric thin film resonator.
Figure 1B:
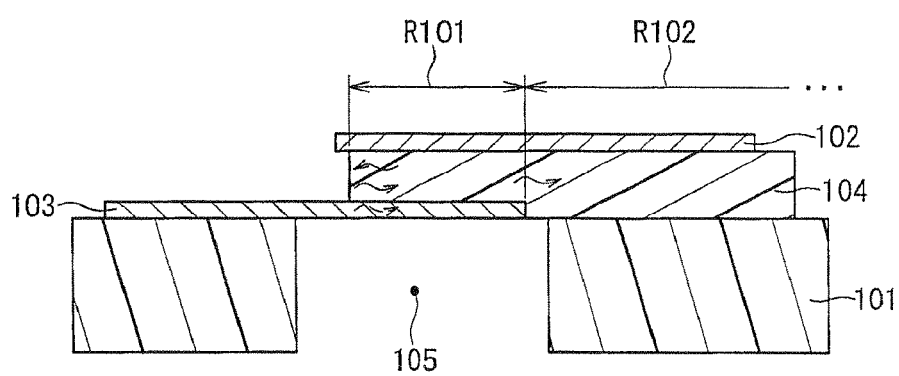
FIG. 1B is a cross-sectional view of the portion Z-Z in FIG. 1A.

FIG. 1A is a plan view illustrating the piezoelectric thin film resonator disclosed in Japanese Laid-open Patent Publication No. 2007-300430. FIG. 1B is a cross-sectional view of the portion Z-Z in FIG. 1A. In the piezoelectric thin film resonator illustrated in FIGS. 1A and 1B, a laminate film including an upper electrode 102, a lower electrode 103 and a piezoelectric film 104 is formed on a substrate 101. A resonance portion R101 is an area where the upper electrode 102, the lower electrode 103 and the piezoelectric film 104 overlap with each other. An air gap 105 is formed in the substrate 101 at a portion under the resonance portion R101. The shape of the resonance portion R101 is square.

In the piezoelectric thin film resonator illustrated in FIGS. 1A and 1B, when the magnitude relationship in acoustic velocity between the resonance portion and the non-resonance portion is a relationship that causes the lateral leakage of acoustic waves, the acoustic waves leak from the resonance portion R101 in the lateral direction towards the non-resonance portion R102 through the piezoelectric film 104 (see the arrows in FIG. 1A). For this reason, the piezoelectric film 104 in the non-resonance portion R102 is subjected to patterning such that at least a portion (end portion 104a) of the periphery of the piezoelectric film 104 is placed inwardly than the periphery of the upper electrode 102. Consequently, the end portion 102a of the upper electrode 102 becomes like a hood with respect to the piezoelectric film 104. The upper electrode 102 having the hood-like end portion 102a absorbs vibrations of the piezoelectric film 104 and traps the acoustic waves that leak from the lower electrode 103 in the lateral direction.

However, in order to increase the Q-value of the piezoelectric thin film resonator illustrated in FIG. 1, the over etching amount of the piezoelectric film 104 needs to be increased to further increase the length of the hood-like end portion 102a. When the length of the hood-like end portion 102a is increased, the mechanical strength of the end portion 102a is difficult to maintain. For this reason, it has been difficult to increase the Q-value while maintaining the mechanical strength of the end portion 102a.

Figure 2A:
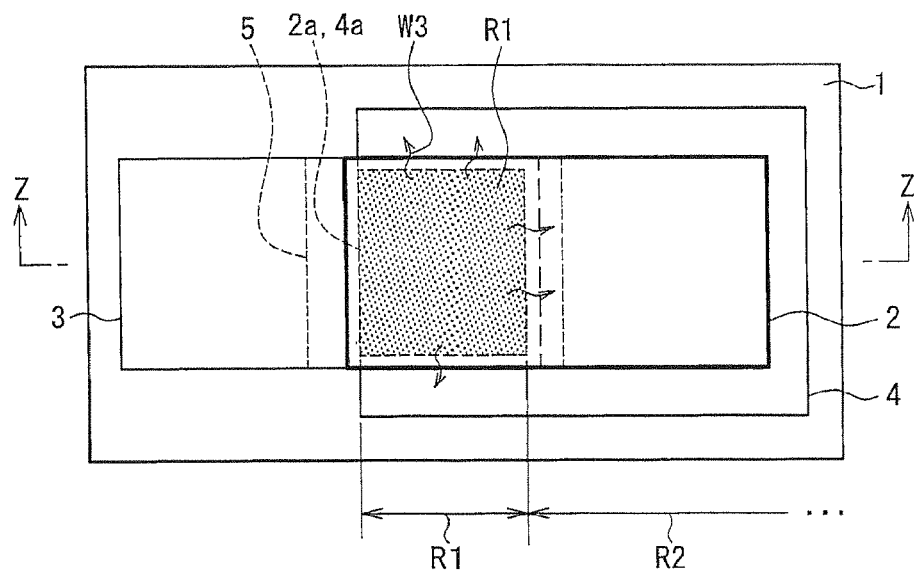
FIG. 2A is a plan view illustrating a piezoelectric thin film resonator according to one embodiment.
Figure 2B:
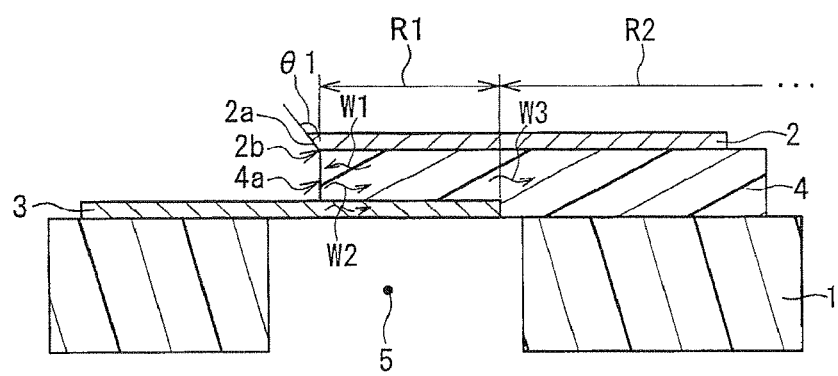
FIG. 2B is a cross-sectional view of the portion Z-Z in FIG. 2A.

FIG. 2A is a plan view illustrating a piezoelectric thin film resonator according to one embodiment. FIG. 2B is a cross-sectional view of the portion Z-Z in FIG. 2A. The piezoelectric thin film resonator includes a substrate 1, an upper electrode 2, a lower electrode 3 and a piezoelectric film 4. The lower electrode 3 is provided on the surface of the substrate 1. The piezoelectric film 4 is provided on top of the substrate 1 and the lower electrode 3. The upper electrode 2 is provided on top of the piezoelectric film 4. The piezoelectric film 4 is interposed between the upper electrode 2 and the lower electrode 3. At least a portion of the upper electrode 2 and that of the lower electrode 3 oppose each other. A resonance portion R1 is an area where the upper electrode 2 and the lower electrode 3 oppose each other. As illustrated in FIG. 2A, the resonance portion R1 has a square plane shape. An air gap 5 is formed in the substrate 5 at a portion under the resonance portion R1.

At least a portion (end portion 2a in the configuration illustrated in FIGS. 2A and 2B) of the periphery of the upper electrode 2 has a reversely tapered cross-sectional shape. An angle $\Theta 1$ of the end portion 2a is preferably 90° or more. A lower end 2b is an end portion of the end portion 2a in the thickness direction of the upper electrode 2. The lower end 2b is placed so as to coincide with or to be in the vicinity of an end portion 4a of the piezoelectric film 4. It is to be noted that "the periphery of the upper electrode 2" refers to the portion surrounded by a thick line in FIG. 2A, and corresponds to the periphery when viewed from the normal direction of the main surface of the upper electrode 2.

In the piezoelectric thin film resonator illustrated in FIGS. 2A and 2B, the upper electrode 2 absorbs vibrations of the piezoelectric film 4. The piezoelectric thin film resonator can trap an acoustic wave W1 and a reflected wave W2 reflected by the end portion 4a of the piezoelectric film 4 within the resonance portion R1. Therefore, in the piezoelectric thin film resonator, the leakage of acoustic waves (lateral leakage) from the resonance portion R1 to the lower electrode 3 can be significantly reduced and the Q-value can be increased.

Furthermore, by setting the angle $\Theta1$ of the end portion 2a of the upper electrode 2 to 90° or more and placing the lower end 2b so as to coincide with or to be in the vicinity of the end portion 4a of the piezoelectric film 4, having a high mechanical strength becomes less necessary for the end portion 2a sticking out like a hood. Thus, it is possible to ensure that the end portion 2a sticks out in a large amount. Accordingly, the Q-value can be further increased.

Here, the end portion 4a of the piezoelectric film 4 reflects most of the acoustic wave W1. Moreover, since leaking in the lateral direction becomes difficult for the acoustic wave (reflected wave W2) reflected by the end portion 4a, the acoustic wave will be trapped in the resonance portion R1. When the reflected wave W2 is present in the resonance portion R1 as a lateral standing wave, a ripple may occur in the pass band. In order to suppress the occurrence of such a ripple, the shape of the resonance portion may be changed to a shape other than square.

Figure 3A:
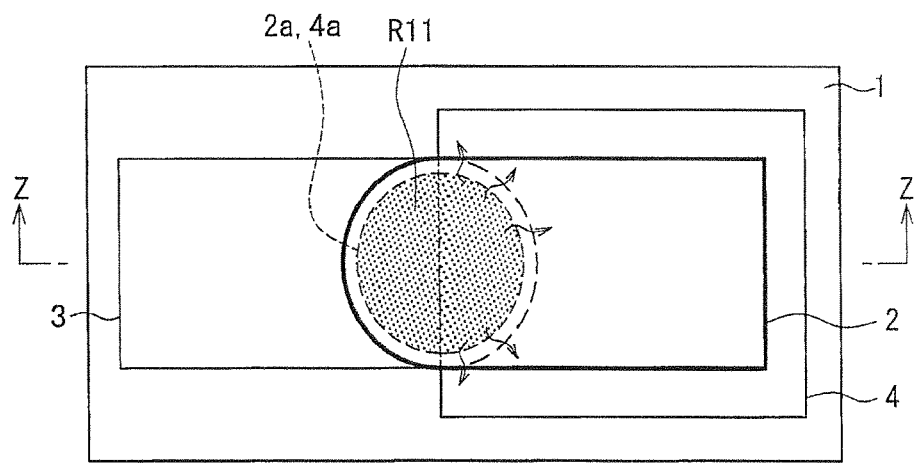
FIG. 3A is a plan view illustrating a piezoelectric thin film resonator with an elliptic resonance portion.
Figure 3B:
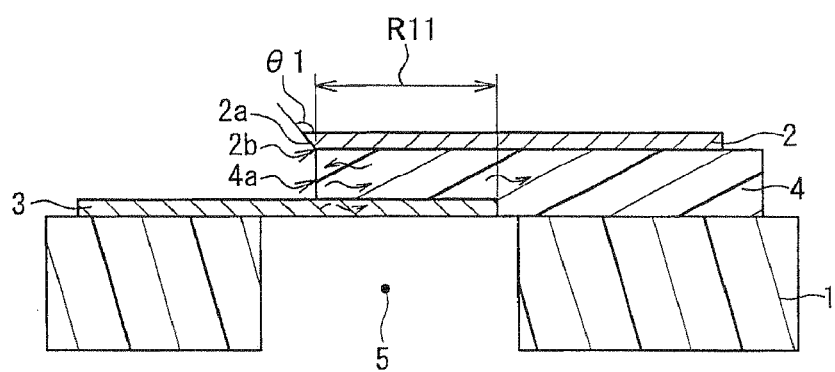
FIG. 3B is a cross-sectional view of the portion Z-Z in FIG. 3A.

FIG. 3A is a plan view illustrating a piezoelectric thin film resonator with an elliptic resonance portion R11. FIG. 3B is a cross-sectional view of the portion Z-Z in FIG. 3A. As illustrated in FIG. 3A, by setting the shape of the resonance portion R11 to an elliptic shape, it becomes difficult for conditions for lateral resonance to be met. Thus, it is possible to suppress the occurrence of a lateral standing wave within the resonance portion R11.

Figure 4A:
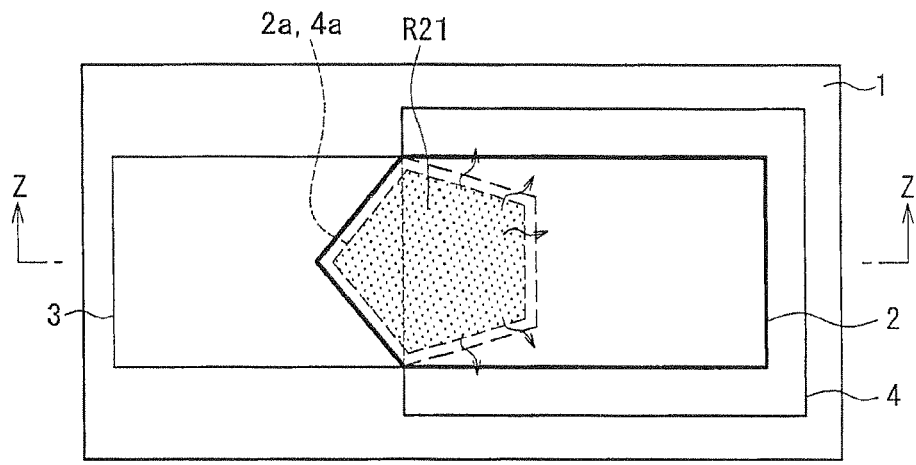
FIG. 4A is a plan view illustrating a piezoelectric thin film resonator with a pentagonal resonance portion.
Figure 4B:
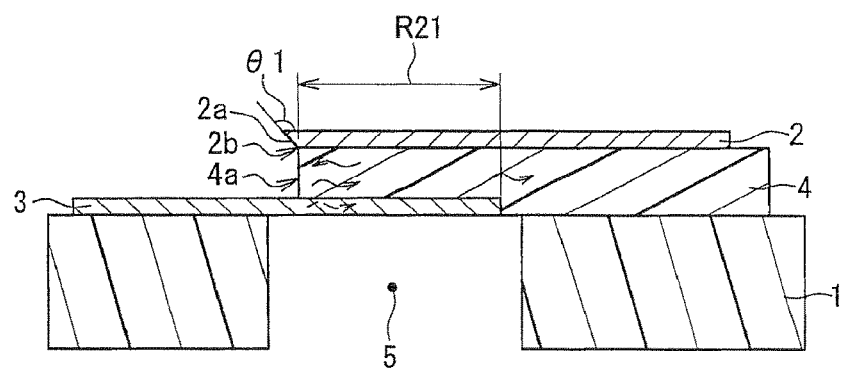
FIG. 4B is a cross-sectional view of the portion Z-Z in FIG. 4A.

FIG. 4A is a plan view illustrating a piezoelectric thin film resonator with a polygonal resonance portion R21. FIG. 4B is a cross-sectional view of the portion Z-Z in FIG. 4A. The piezoelectric thin film resonator illustrated in FIGS. 4A and 4B can suppress the occurrence of ripple. In the piezoelectric thin film resonator illustrated in FIGS. 4A and 4B, the resonance portion R21 has a polygonal shape that does not include two parallel sides. The resonance portion R21 preferably has a pentagonal shape. It is to be noted that the shape of the resonance portion R21 illustrated in FIGS. 4A and 4B is an example. So long as the shape is a polygonal shape that does not include two parallel sides, it may be a triangular or heptagonal shape. By configuring the resonance portion in this way, it becomes difficult for conditions for lateral resonance to be met. Thus, it is possible to suppress the occurrence of a lateral standing wave within the resonance portion R21.

It is preferable that the piezoelectric film 4 is formed using aluminum nitride (AlN). By forming the piezoelectric film 4 using AlN, a piezoelectric thin film resonator having a favorable Q-value can be achieved.

It is preferable that the upper electrode 2 and the lower electrode 3 are formed using a material having a high acoustic impedance. In the present embodiment, the electrodes are formed using Ruthenium (Ru) as an example.

As illustrated in FIG. 2A, it is preferable that the area of the air gap 5 is larger than that of the resonance portion R1. By configuring in this way, the resonance portion itself can vibrate freely, resulting in an improvement of the Q-value.

For the electrode films in the piezoelectric thin film resonator, aluminum (Al), copper (Cu), molybdenum (Mo), tungsten (W), tantalum (Ta), platinum (Pt), Ruthenium (Ru), Rhodium (Rh), Iridium (Ir) or the like may be used. Further, aluminum nitride (AlN), zinc oxide (ZnO), lead zirconate titanate (PZT), lead titanate ($PbTiO_3$) or the like may be used for the piezoelectric film. Further, silicon (Si), glass or the like may be used for the substrate.

2. Method of Producing Piezoelectric Thin Film Resonator

Example 1

Hereinafter, a production method in which the upper electrode 2 is formed using a $SiO_2$ film will be described.

Figure 5A:
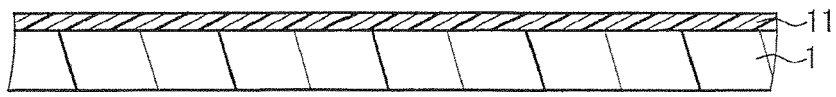
FIGS. 5A to 5L are cross-sectional views each illustrating a production process of a piezoelectric thin film resonator according to Example 1.

As illustrated in FIG. 5A, first, a first sacrificial layer 11 is formed on the substrate 1. Silicon (Si) may be used for the material of the substrate 1. Magnesium oxide (MgO) may be used for the material of the first sacrificial layer 11. Spattering or vapor deposition may be used for forming the layer. In addition to the Si substrate, a quartz substrate, a glass substrate, a gallium arsenide (GaAs) substrate, etc. may be used for the substrate 1. The substrate 1 is preferably made of a material resistant to etching during the air gap formation process, which will be described below. For the first sacrificial layer 11, it is preferable to use a material that can be easily etched by an etchant such as zinc oxide (ZnO), germanium (Ge) or titanium (Ti).

Figure 5B:
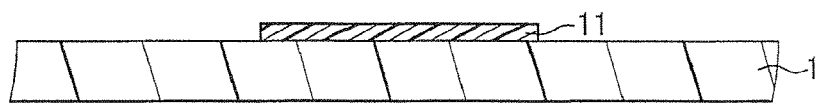

Next, as illustrated in FIG. 5B, the first sacrificial layer 11 is patterned in an arbitrary shape. Exposure techniques and etching techniques may be used for the patterning.

Figure 5C:
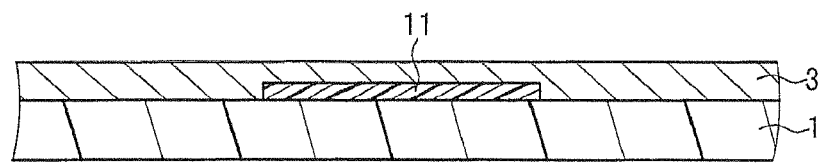

Then, as illustrated in FIG. 5C, the lower electrode 3 is formed on the substrate 1 and the first sacrificial layer 11. Ruthenium (Ru)/chrome (Cr) may be used for the lower electrode 3. Spattering, etc. may be used for forming the film.

Figure 5D:
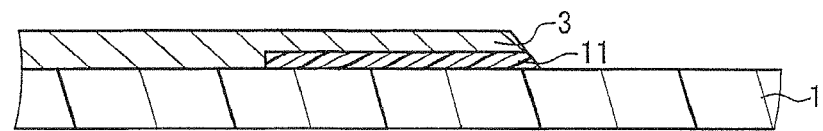

After that, as illustrated in FIG. 5D, the first sacrificial layer 11 and the lower electrode 3 are patterned in an arbitrary shape. Exposure techniques and etching techniques may be used for the patterning. At this time, a path for introducing an etchant for the sacrificial layer (not illustrated) may be formed on the lower electrode 3 and an etchant introduction hole (not illustrated) for etching the sacrificial layer at the time of forming the air gap may be formed at the tip of the introduction path.

Figure 5E:
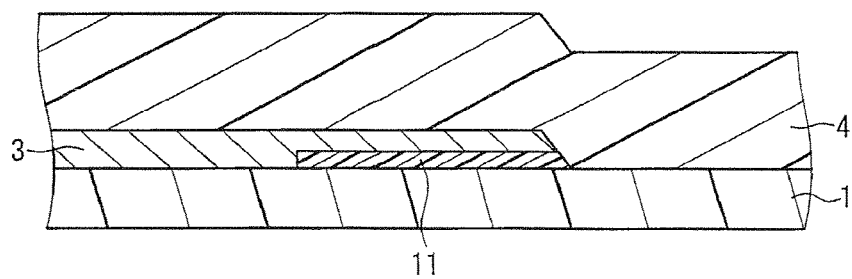

Thereafter, as illustrated in FIG. 5E, the piezoelectric film 4 is formed on the substrate 1, the lower electrode 3 and the first sacrificial layer 11. AlN may be used for the material of the piezoelectric film 4. Spattering, etc. may be used for forming the film.

Figure 5F:
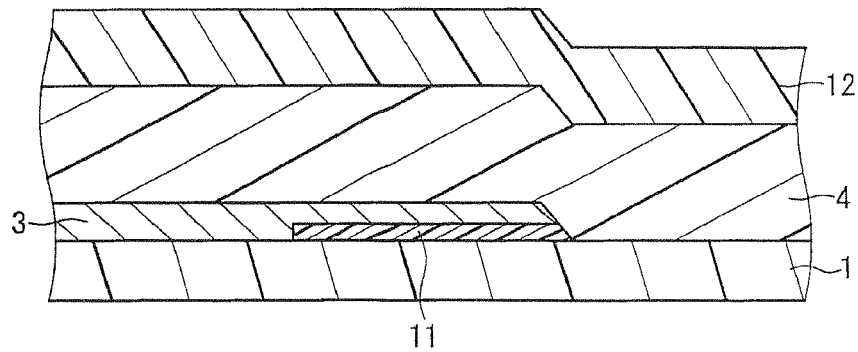

Next, as illustrated in FIG. 5F a second sacrificial layer 12 is formed on the piezoelectric layer 4. A silicon oxide ($SiO_2$) film may be used for the material of the second sacrificial layer 12. Spattering, etc. may be used for forming the film. It is preferable to form the second sacrificial layer 12 so as to have a larger thickness than the upper electrode 2. The material of the second sacrificial layer 12 is not limited to $SiO_2$, and a material having etching selectivity on the upper electrode 2 is preferably adopted.

Figure 5G:
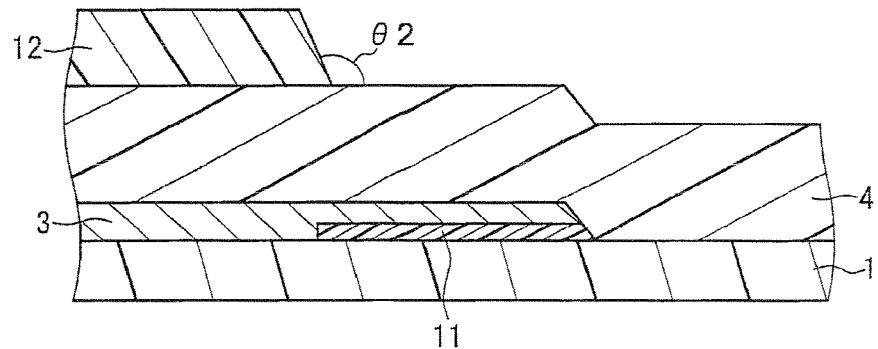

Then, as illustrated in FIG. 5G, the second sacrificial layer 12 is pattered. Exposure techniques and etching techniques may be used for the patterning method. At this time, dry etching may be used for etching the $SiO_2$ film as the second sacrificial layer 12. Further, the second sacrificial layer 12 is etched such that the angle of its end portion becomes an angle $\Theta2$. The angle $\Theta2$ is preferably 90° or more.

Figure 5H:
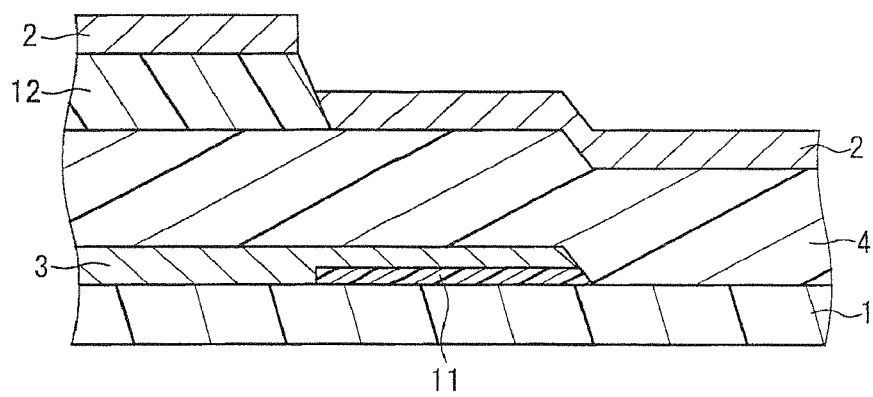

Thereafter, as illustrated in FIG. 5H, the upper electrode 2 is formed on the piezoelectric film 4 and the second sacrificial layer 12. Ru may be used for the material of the upper electrode 2. Spattering, etc. may be used for forming the film.

Figure 5I:
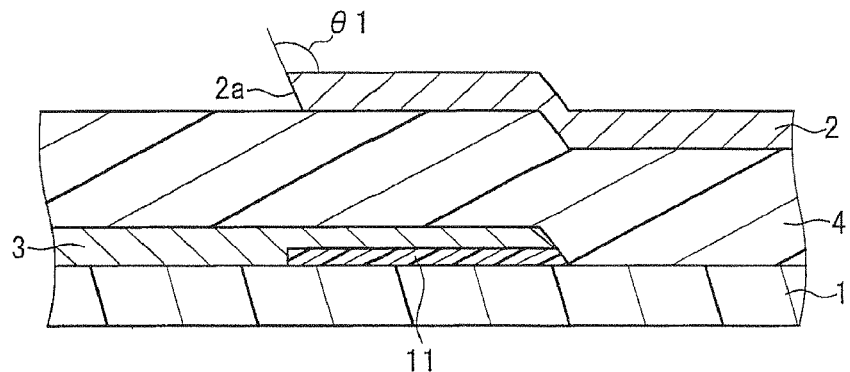

Next, as illustrated in FIG. 5I, the $SiO_2$ film as the second sacrificial layer 12 is removed by wet etching. As a result, the upper electrode 2 can be formed so as to have at least a portion opposing the lower electrode 3 and the end portion 2a of the upper electrode 2 can be formed in a reversely tapered shape having a desired angle Θ1.

Figure 5J:
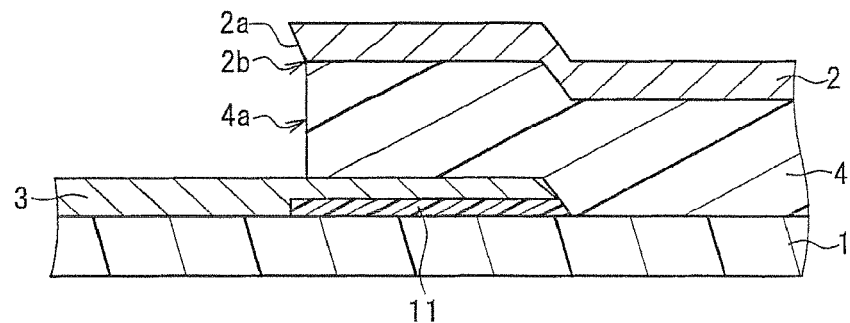

Then, as illustrated in FIG. 5J, the piezoelectric film 4 is patterned in a desired shape. Exposure techniques and etching techniques may be used for the patterning. Wet etching may be used for etching the AlN as the piezoelectric film 4. The piezoelectric film 4 is patterned such that the lower end 2b of the end portion 2a of the upper electrode 2 is placed to coincide with or to be in the vicinity of the end portion 4a of the piezoelectric film 4. Here, dry etching may used for etching the AlN.

Figure 5K:
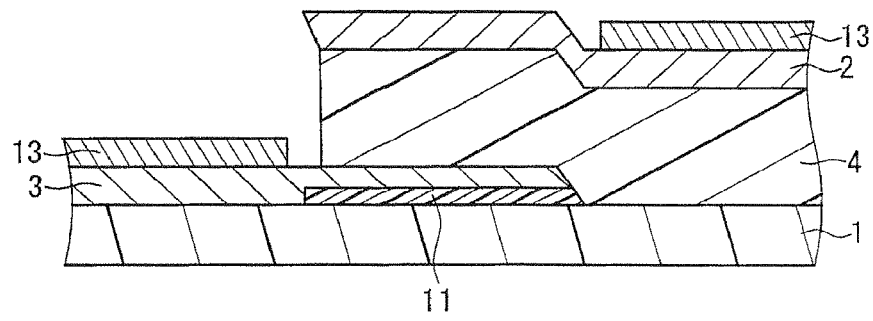

Thereafter, as illustrated in FIG. 5K, a bump pad 13 is formed on the upper electrode 2 and the lower electrode 3. A lift off method may be used for forming the bump pad 13.

Figure 5L:
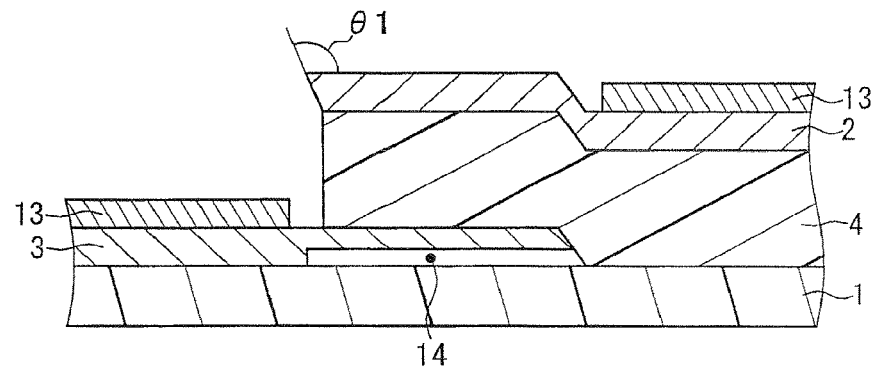

Finally, as illustrated in FIG. 5L, the first sacrificial layer 11 is removed. An etchant is injected into the introduction hole (not illustrated) for the removal of the layer. The etchant injected into the introduction hole passes through the introduction path, flows into the bottom of the lower electrode 3 and removes the first sacrificial layer 11 by etching the layer. Consequently, an air gap 14 having a dome-shaped dilation is formed under the portion where the upper electrode 2 and the lower electrode 3 oppose each other. The air gap 14 bulged like a dome is not illustrated in the drawing.

It is to be noted that the etchant for etching the first sacrificial layer 11 preferably has less effect on parts of the piezoelectric thin film resonator except the sacrificial layer. In particular, the etchant preferably has less effect on the electrode material on the first sacrificial layer 11 that comes into contact with the etchant.

Further, by forming the laminate (combined film) composed of the lower electrode 3, the piezoelectric film 4 and the upper electrode 2 under such conditions that the stress of the laminate becomes compressive stress, the combined film bulges by the time the etching of the first sacrificial layer 11 ends. Consequently, the dome-shaped air gap 14 can be formed between the lower electrode 3 and the substrate 1.

The materials of the substrate 1, the upper electrode 2, the lower electrode 3 and the piezoelectric film 4 are not limited to those described above and other materials such as those described in the prior art may be used. Further, instead of the physical air gap 14 described above, an acoustic reflection film having a thickness of λ/4 (λ: wavelength of acoustic wave) formed by alternately laminating films having a high acoustic impedance and films having a low acoustic impedance may be used.

Example 2

Hereinafter, a production method in which the upper electrode 2 is formed using a photoresist will be described.

Figure 6A:
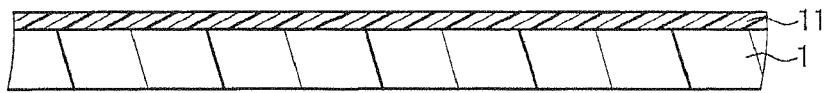
FIGS. 6A to 6K are cross-sectional views each illustrating a production process of a piezoelectric thin film resonator according to Example 2.

As illustrated in FIG. 6A, first, the first sacrificial layer 11 is formed on the substrate 1. Silicon (Si) may be used for the material of the substrate 1. Magnesium oxide (MgO) may be used for the material of the first sacrificial layer 11. Spattering or vapor deposition may be used for forming the layer. In addition to the Si substrate, a quartz substrate, a glass substrate, a gallium arsenide (GaAs) substrate, etc. may be used for the substrate 1. The substrate 1 is preferably made of a material resistant to etching during the air gap formation process, which will be described below. For the first sacrificial layer 11, it is preferable to use a material that can be easily etched by an etchant, such as zinc oxide (ZnO), germanium (Ge) or titanium (Ti).

Figure 6B:
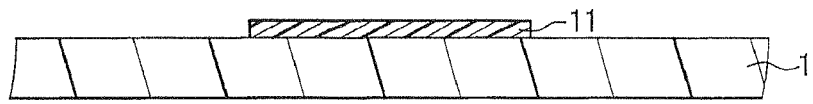

Next, as illustrated in FIG. 6B, the first sacrificial layer 11 is patterned in an arbitrary shape. Exposure techniques and etching techniques may be used for the patterning.

Figure 6C:
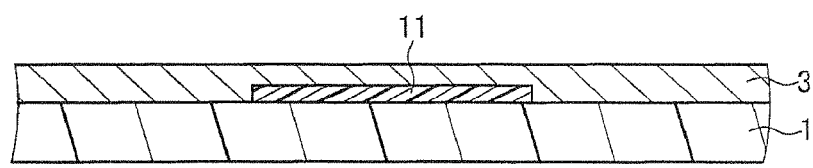

Then, as illustrated in FIG. 6C, the lower electrode 3 is formed on the substrate 1 and the first sacrificial layer 11. Ruthenium (Ru)/chrome (Cr) may be used for the lower electrode 3. Spattering, etc. may be used for forming the film.

Figure 6D:
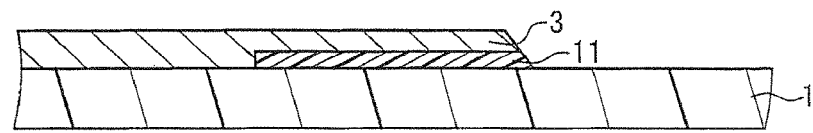

After that, as illustrated in FIG. 6D, the first sacrificial layer 11 and the lower electrode 3 are patterned in an arbitrary shape. Exposure techniques and etching techniques may be used for the patterning. At this time, a path for introducing an etchant for the sacrificial layer (not illustrated) may be formed on the lower electrode 3 and an etchant introduction hole (not illustrated) for etching the sacrificial layer at the time of forming the air gap may be formed at the tip of the introduction path.

Figure 6E:
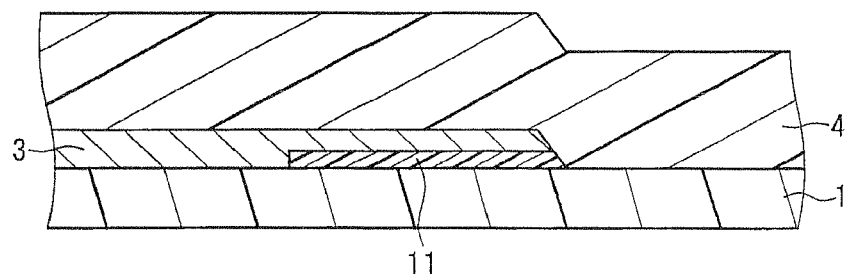

Thereafter, as illustrated in FIG. 6E, the piezoelectric film 4 is formed on the substrate 1, the lower electrode 3 and the first sacrificial layer 11. AlN may be used for the material of the piezoelectric film 4. Spattering, etc. may be used for forming the film.

Figure 6F:
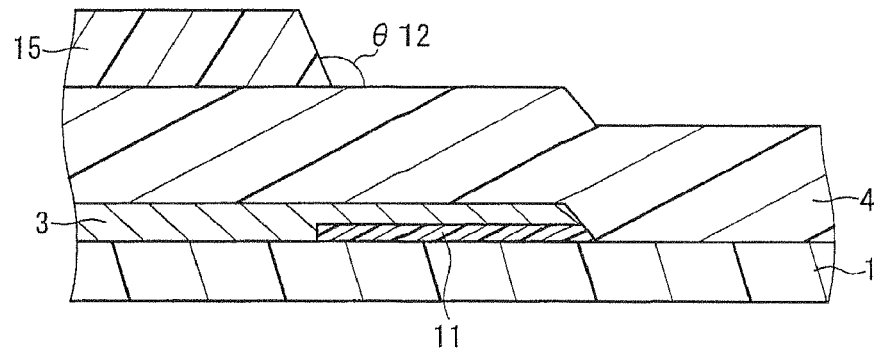

Next, as illustrated in FIG. 6F a photoresist 15 (a second sacrificial layer in Example 2) is applied to the piezoelectric film 4. Then, the photoresist 15 is patterned using exposure techniques. At this time, the photoresist 15 is patterned such that the angle of the end portion of the photoresist 15 becomes an angle Θ11. The angle Θ11 is preferably 90° or more.

Figure 6G:
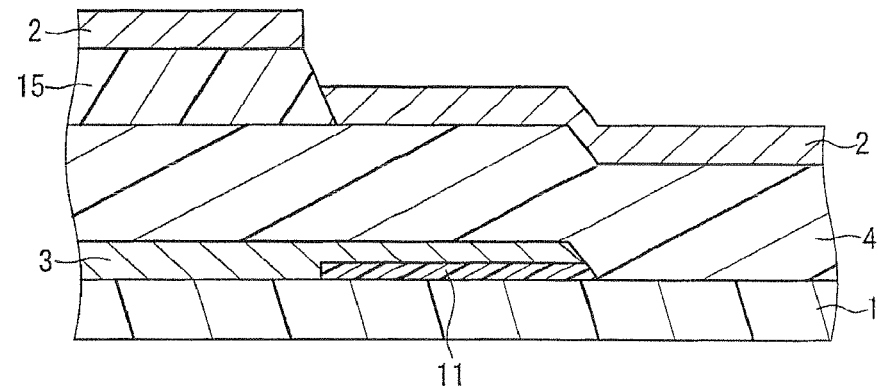

Thereafter, as illustrated in FIG. 6G, the upper electrode 2 is formed on the piezoelectric film 4 and the photoresist 15. Ru may be used for the material of the upper electrode 2. Spattering, etc. may be used for forming the film.

Figure 6H:
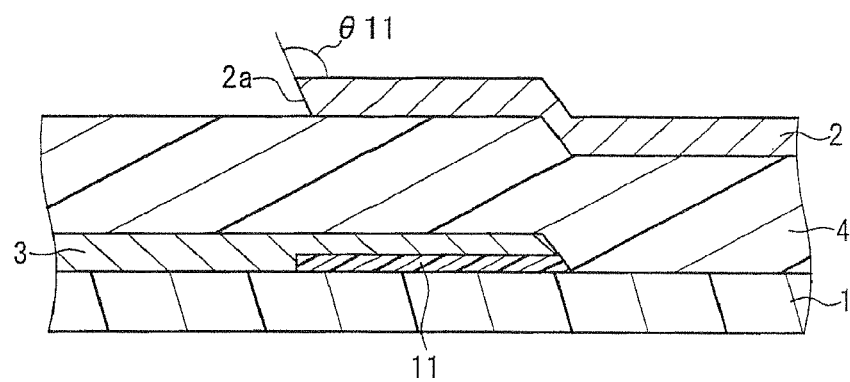

Next, as illustrated in FIG. 6H, the photoresist 15 as the second sacrificial layer is removed using an organic solvent or the like. As a result, the upper electrode 2 can be formed so as to have at least a portion opposing the lower electrode 3 and the end portion 2a of the upper electrode 2 can be formed in a reversely tapered shape having a desired angle Θ12. The angle Θ12 is preferably 90° or more.

Figure 6I:
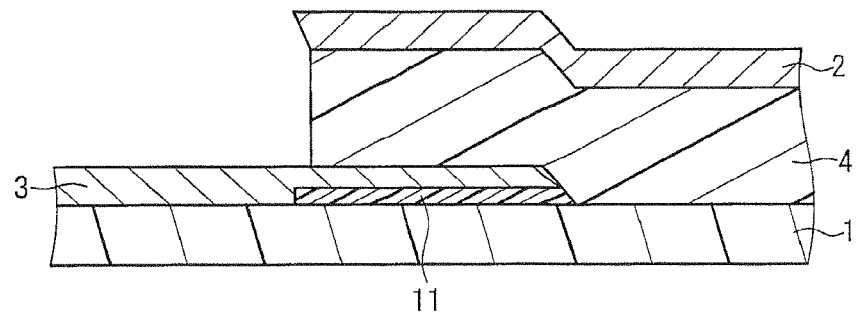

Then, as illustrated in FIG. 6I, the piezoelectric film 4 is patterned in a desired shape. Exposure techniques and etching techniques may be used for the patterning. At this time, wet etching is preferably used for etching the AlN as the piezoelectric film 4. The piezoelectric film 4 is patterned such that the lower end 2b of the end portion 2a of the upper electrode 2 is placed to coincide with or to be in the vicinity of the end portion 4a of the piezoelectric film 4. Here, dry etching may used for etching the piezoelectric film 4 (AlN).

Figure 6J:
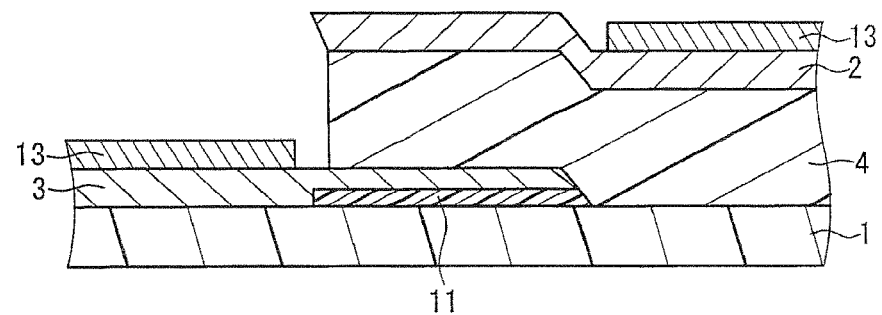

Thereafter, as illustrated in FIG. 6J, a bump pad 13 is formed on the upper electrode 2 and the lower electrode 3. A la off method may be used for forming the bump pad 13.

Figure 6K:
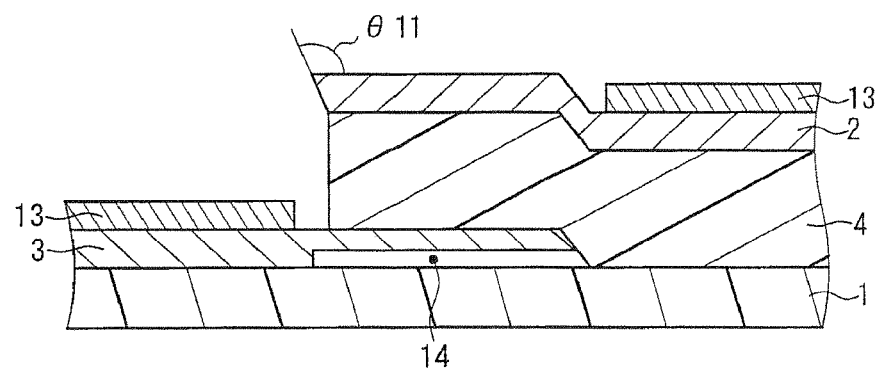

Finally, as illustrated in FIG. 6K, the first sacrificial layer 11 is removed. An etchant is injected into the introduction hole (not illustrated) for the removal of the layer. The etchant injected into the introduction hole passes through the introduction path, flows into the bottom of the lower electrode 3 and removes the first sacrificial layer 11 by etching the layer. Consequently, the air gap 14 bulged like a dome is formed under the portion where the upper electrode 2 and the lower electrode 3 oppose each other. The illustration of the air gap 14 bulged like a dome is omitted in the drawing.

Although the air gap 14 is formed between the lower electrode 3 and the substrate 1 in Examples 1 and 2, the air gap may be formed in the substrate 1.

Figure 7:
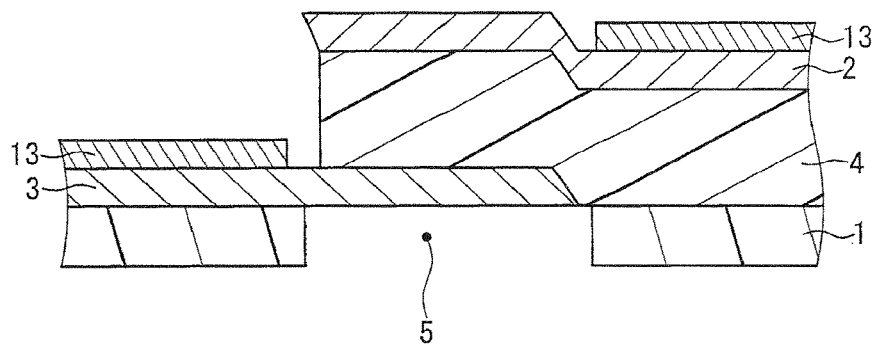
FIG. 7 is a cross-sectional view illustrating a piezoelectric thin film resonator in which an air gap is formed in the substrate.

FIG. 7 is a cross-sectional view illustrating a piezoelectric thin film resonator in which an air gap is formed in the substrate 1. In the piezoelectric thin film resonator illustrated in FIG. 7, after forming the bump pad 13 described in Examples 1 and 2, a resist pattern having an opening that includes the area where the upper electrode 2 and the lower electrode 3 oppose each other is formed on the backside of the substrate 1. Next, dry etching is carried out on the resist pattern such that the shape of the side wall becomes substantially perpendicular to the surface (the surface on which the lower electrode 3, etc. are formed) of the substrate 1. Specifically, the dry etching is carried out by repeating etching using an SF6 (sulfur hexafluoride) gas and a side wall protection film formation process using a C4F8 (perfluorocyclobutane) gas alternately from the backside of the substrate 1. As a result, an air gap 5 can be formed at a portion under the area where the upper electrode 2 and the lower electrode 3 oppose each other.

Figure 8A:
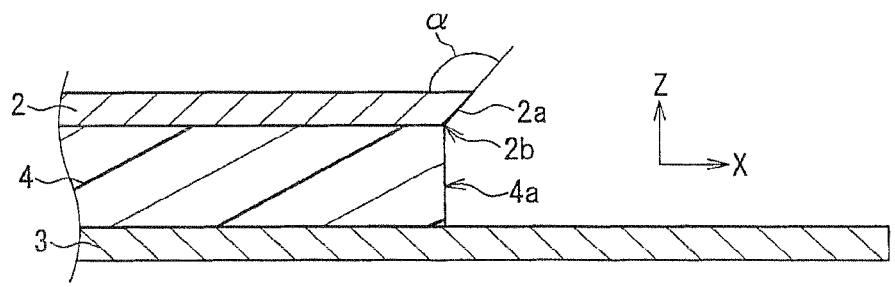
FIG. 8A is a cross-sectional view illustrating a model of a piezoelectric thin film resonator.
Figure 8B:
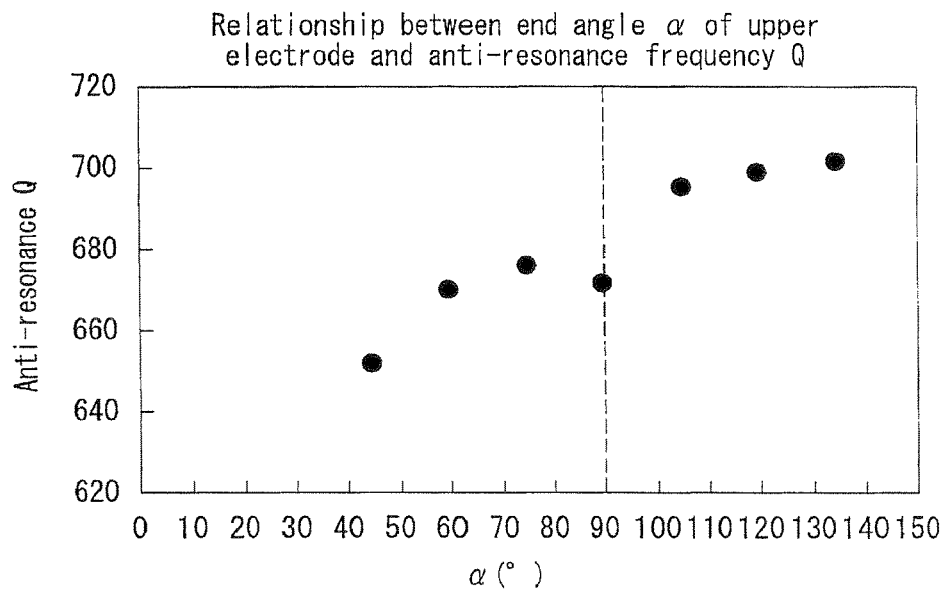
FIG. 8B is a characteristic diagram illustrating the relationship between the angle of an end portion of an upper electrode and an anti-resonance Q-value.

FIG. 8A is a diagram illustrating a model of a piezoelectric thin film resonator used to simulate the relationship between the angle of the end portion of the upper electrode and a Q-value. FIG. 8B is a characteristic diagram illustrating the relationship between an angle α of the end portion of the upper electrode and a Q-value at an anti-resonance frequency (hereinafter referred to as an anti-resonance Q). In the characteristic diagram of FIG. 8B, the angle α of the end portion 2a of the upper electrode 2 is changed using general FEM (Finite Element Method) software and the results of calculating the anti-resonance Q of the piezoelectric thin film resonator are plotted. In the model illustrated in FIG. 8A, the upper electrode 2 and the lower electrode 3 are made of Ru and the piezoelectric film 4 is made of AlN and the lower end 2b of the end portion 2a of the upper electrode 2 is placed so as to coincide with or to be in the vicinity of the end portion 4a of the piezoelectric film 4. As can be seen from the graph, the anti-resonance Q is relatively small when the angle α is 90° or less but when the angle becomes 90° or more, the anti-resonance Q increases sharply. Thus, by forming the angle α of the end portion 2a of the upper electrode 2 in a reversely tapered shape (larger than 90°), the occurrence of the lateral leakage in the piezoelectric thin film resonator can be suppressed and the Q-value can be increased. Further, when this piezoelectric thin film resonator having a large Q-value is applied to a filter or a branching filter, a low-loss filter can be achieved.

Further, by using a photosensitive resin for the material of the first sacrificial layer 11, a desired pattern can be formed on the first sacrificial layer 11 only by exposure techniques for the sacrificial layer. Therefore, without carrying out an etching process, the upper electrode 2 can be formed on the first sacrificial layer 11 on which a pattern is formed.

Further, when removing the first sacrificial layer 11, since the first sacrificial layer 11 can be easily removed by an organic solvent or the like, there is no need to consider about the etching selectivity on the upper electrode 2. Thus, the range of choices for the material used for the upper electrode 2 can be broadened.

3. Configuration of Filter

Figure 9:
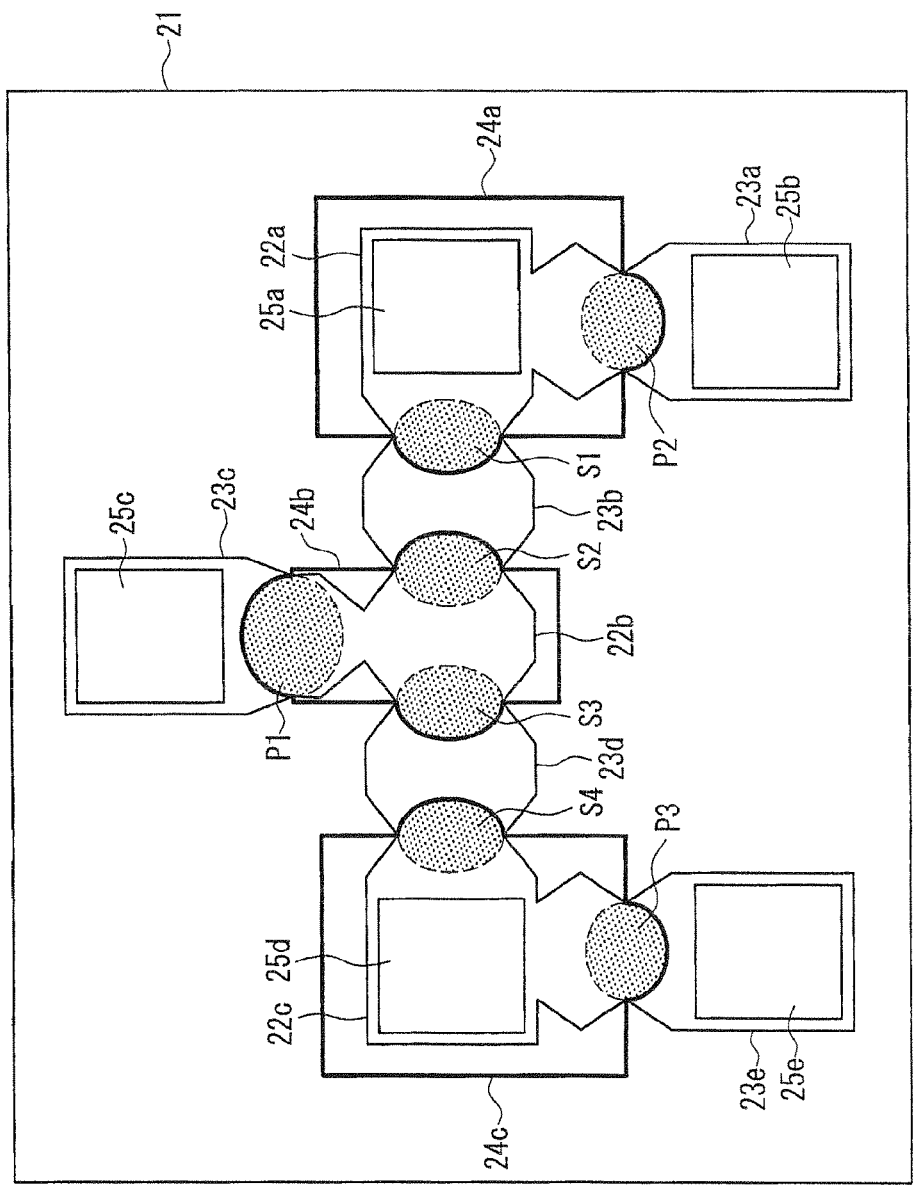
FIG. 9 is a plan view illustrating a filter.

FIG. 9 is a plan view illustrating a filter using the piezoelectric thin film resonators according to the embodiment. The filter illustrated FIG. 9 is a ladder filter in which series resonators S1 to S4 and parallel resonators P1 to P3 are connected to each other in a ladder shape. The series resonators S1 to S4 and the parallel resonators P1 to P3 have the same structure as that of the piezoelectric thin film resonator according to the embodiment. The filter includes a substrate 21, upper electrodes 22a to 22c, lower electrodes 23a to 23e, piezoelectric films 24a to 24c and bump pad portions 25a to 25e. In FIG. 9, the areas that are hatched with dots are resonance portions. The resonance portions are each included in the series resonators S1 to S4 and the parallel resonators P1 to P3. The resonance portions in the series resonators S1 to S4 and the parallel resonators P1 to P3 have an elliptic shape.

By incorporating the piezoelectric thin film filters according to Embodiment 1 in a filter, a low-loss filter can be achieved.

Although the configuration of the ladder filter including the piezoelectric thin film resonators has been described in the present embodiment, the piezoelectric thin film resonator can be applied to other types of filters such as a lattice filter.

A low-loss filter can be achieved as long as the piezoelectric thin film resonator according to the present embodiment is used for at least one of the series resonators S1 to S4 and the parallel resonators P1 to P3 in the filter illustrated in FIG. 9.

4. Configuration of Communication Module

Figure 10:
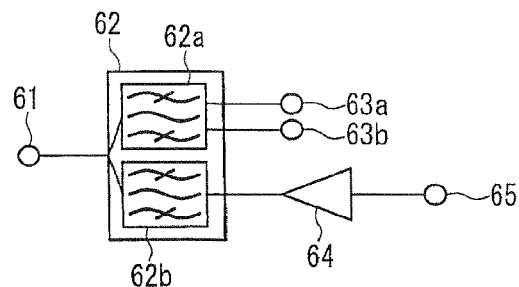
FIG. 10 is a block diagram illustrating a communication module.

FIG. 10 is a diagram illustrating an example of a communication module including the piezoelectric thin film resonator or the filter according to the present embodiment. As illustrated in FIG. 10, a duplexer 62 includes a reception filter 62a and a transmission filter 62b. Further, reception terminals 63a and 63b supporting balanced output are connected to the reception filter 62a, for example. Further, the transmission filter 62b is connected to a transmission terminal 65 through a power amplifier 64. Here, the duplexer 62 can be achieved by using a duplexer including the piezoelectric thin film resonator or the filter according to the present embodiment.

At the time of reception operation, the reception filter 62a allows, among reception signals inputted through an antenna terminal 61, signals in a predetermined frequency band to pass through and outputs the signals to the outside from the reception terminals 63a and 63b. Further, at the time of transmission operation, the transmission filter 62b allows, among transmission signals inputted through the transmission terminal 65 and amplified by the power amplifier 64, signals in a predetermined frequency band to pass through and outputs the signals to the outside from the antenna terminal 61.

By incorporating the piezoelectric resonator or the filter according to the present embodiment or a duplexer including the resonator or the filter in a communication module, a low-loss communication module can be achieved.

It is to be noted that the configuration of the communication module illustrated in FIG. 10 is an example. Thus, the same effects can be obtained by incorporating the electronic components of the present invention in communication modules in other forms.

5. Configuration of Communication Device

Figure 11:
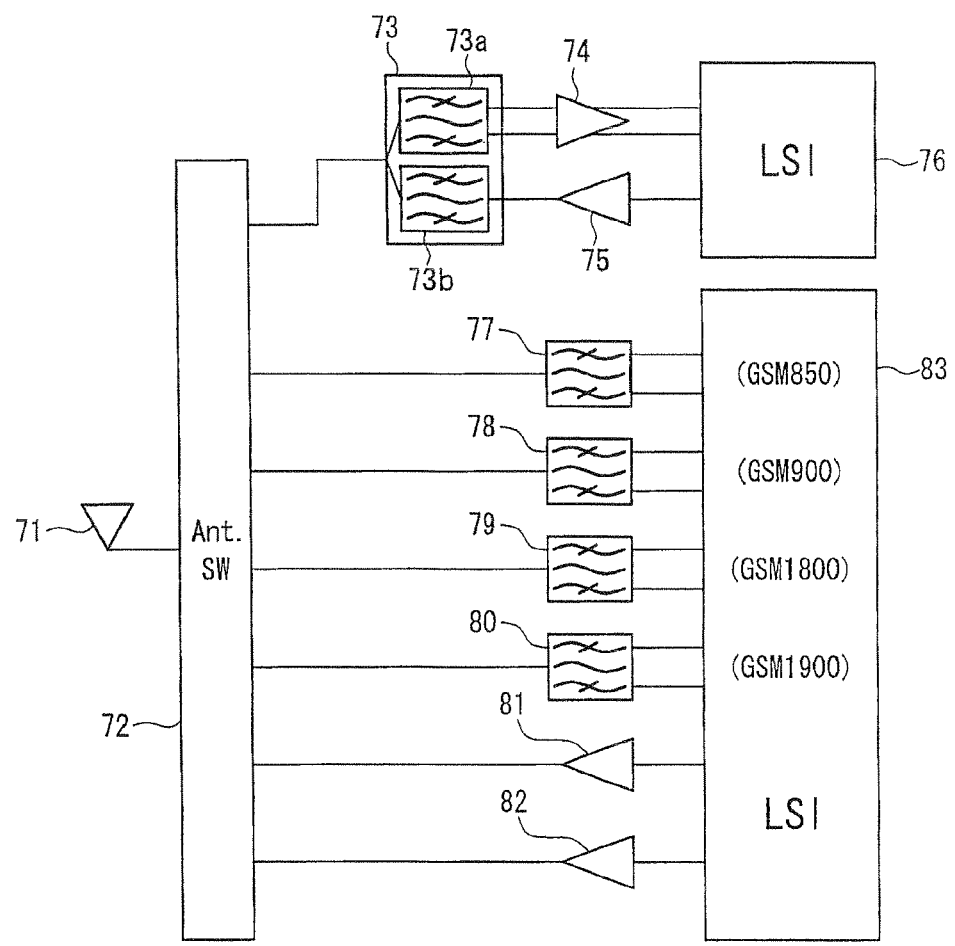
FIG. 11 is a block diagram illustrating a communication device.

FIG. 11 is a diagram illustrating an RF block of a mobile phone terminal as an example of a communication device including the piezoelectric thin film resonator, the filter, the duplexer or the above-described communication module according to the present embodiment. The configuration illustrated in FIG. 11 is that of a mobile phone terminal compatible with the GSM (Global System for Mobile Communications) communication system and the W-CDMA (Wideband Code Division Multiple Access) communication system. The GSM communication system in the present embodiment supports a 850 MHz band, a 950 MHz band, a 1.8 GHz band and a 1.9 GHz band. Although the mobile phone terminal includes a microphone, a speaker, an LCD display, etc. in addition to the components illustrated in FIG. 11, they are not illustrated in the drawing because they are not necessary for describing the present embodiment. Here, a duplexer 73 can be achieved by using a duplexer including the piezoelectric thin film resonator according to the present embodiment.

First, depending on the communication system (W-CDMA or GSM) of reception signals inputted through an antenna 71, an antenna switching circuit 72 selects an LSI required for the operation. When the inputted reception signals correspond to the W-CDMA communication system, the antenna switching circuit 72 switches the LSI to output the reception signals to the duplexer 73. The reception filter 73a restricts the reception signals inputted to the duplexer 73 to those in a predetermined frequency band by the reception filter 73a, and the balanced reception signals are outputted to an LNA 74. The LNA 74 amplifies the inputted reception signals and outputs them to an LSI 76. The LSI 176 demodulates the inputted reception signals to voice signals or controls the operation of each portion in the mobile phone terminal.

On the other hand, at the time of transmitting signals, the LSI 76 generates transmission signals. The generated transmission signals are amplified by a power amplifier 75 and are inputted to the transmission filter 73b. Among the inputted transmission signals, the transmission filter 73b only allows signals in a preset frequency band to pass through. The transmission signals outputted from the transmission filter 73b are outputted to the outside from the antenna 71 through the antenna switching circuit 72.

When the inputted reception signals correspond to the GSM communication system, the antenna switching circuit 72 selects one of the reception filters 77 to 80 in accordance with the frequency band of the signals and outputs the reception signals. The reception signals subjected to the band restriction by one of the reception filters 77 to 80 are inputted to an LSI 83. The LSI 83 demodulates the inputted reception signals to voice signals or controls the operation of each portion in the mobile phone terminal. On the other hand, at the time of transmitting signals, the LSI 83 generates transmission signals. The generated transmission signals are amplified by a power amplifier 81 or 82 and are outputted to the outside from the antenna 71 through the antenna switching circuit 72.

By incorporating the piezoelectric thin film resonator, the filter, the duplexer or the communication module according to the present embodiment in a communication device, a low-loss communication device can be achieved.

6. Effects of Embodiment, etc

In the piezoelectric thin film resonator according to the present embodiment, the end portion 2a of the upper electrode 2 sticks out from the end portion 4 of the piezoelectric film 4 and has a hood-like shape. Further, the lower end 2b of the end portion 2a is placed so as to coincide with or to be in the vicinity of the end portion 4a of the piezoelectric film 4. Further, the angle between the end portion 2a and the upper surface of the upper electrode 2 is set to 90° or more. Consequently, it is possible to trap acoustic waves that propagate through the piezoelectric film 4, and thereby not only that losses can be reduced but also the Q-value can be increased. Further, since it is possible to increase the length of the hood-like end portion 2a, the Q-value can be further increased.

In the piezoelectric thin film resonator according to the present embodiment, it is not necessary to over etch the piezoelectric film 4. Thus, etching time is short and adverse impacts on other materials that form the piezoelectric thin film resonator are small. In the resonator illustrated in FIG. 1, the piezoelectric film 104 needs to be over etched to form the hood-like end portion 102a. Since the exposed portion of the piezoelectric film 104 that is in contact with the upper electrode 102 is small, the etching rate declines significantly and considerable amount of time is required for the over etching. Further, an extension of etching time is highly likely to result in adverse impacts on other materials that form the piezoelectric thin film resonator. In the piezoelectric thin film resonator according to the present embodiment, however, the piezoelectric film 4 does not need to be over etched. Thus, the problems as described above can be avoided.

It is to be noted that the substrate 1 in the embodiment is an example of the substrate of the present invention. The upper electrode 2 in the embodiment is an example of the upper electrode of the present invention. The lower electrode 3 in the embodiment is an example of the lower electrode of the present invention. The piezoelectric film 4 in the embodiment is an example of the piezoelectric film of the present invention. The end portion 2a in the embodiment is an example of the periphery of the upper electrode of the present invention.

The disclosure of the present application is useful for film acoustic bulk resonators (FBAR) and filters and duplexers using the resonators used for mobile communications and high frequency radio communications, such as mobile phones, PHS and wireless LAN.

All examples and conditional language recited herein are intended for pedagogical purposes to aid the reader in understanding the principles of the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiment(s) of the present invention(s) has (have) been described in detail, it should be understood that the various changes, substitutions, and alterations could be made hereto without departing from the spirit and scope of the invention.

The invention claimed is:

1. A piezoelectric thin film resonator comprising:
   a substrate;
   a lower electrode provided on the substrate;
   a piezoelectric film provided on the lower electrode; and
   an upper electrode provided on the piezoelectric film,
   wherein, at least a portion of the upper electrode and that of the lower electrode oppose each other through the piezoelectric film, and at least a portion of a periphery of the upper electrode sticks out from an upper end portion of the piezoelectric film and has a hood-like shape, and at least the portion of the periphery of the upper electrode sticking out like a hood has a reversely tapered shape extending from an edge, or a location adjacent to the edge, of the piezoelectric film.

2. The piezoelectric thin film resonator according to claim 1, wherein the periphery of the upper electrode is placed so as to coincide with or to be in the vicinity of at least a portion of a periphery of the piezoelectric film.

3. The piezoelectric thin film resonator according to claim 1, wherein an area where the upper electrode and the lower electrode oppose each other has an elliptic shape.

4. The piezoelectric thin film resonator according to claim 1, wherein an area where the upper electrode and the lower electrode oppose each other has a polygonal shape that does not include two parallel sides.

5. A filter comprising a piezoelectric thin film resonator, wherein the piezoelectric thin film resonator includes:
   a substrate;
   a lower electrode provided on the substrate;
   a piezoelectric film provided on the lower electrode; and
   an upper electrode provided on the piezoelectric film, wherein, at least a portion of the upper electrode and that of the lower electrode oppose each other through the piezoelectric film, and at least a portion of a periphery of the upper electrode sticks out from an upper end portion of the piezoelectric film and has a hood-like shape, and at least the portion of the periphery of the upper electrode sticking out like a hood has a reversely tapered shape extending from an edge, or a location adjacent to the edge, of the piezoelectric film.

6. The filter according to claim 5, wherein the periphery of the upper electrode is placed so as to coincide with or to be in the vicinity of at least a portion of a periphery of the piezoelectric film.

7. The filter according to claim 5, wherein an area where the upper electrode and the lower electrode oppose each other has an elliptic shape.

8. The filter according to claim 5, wherein an area where the upper electrode and the lower electrode oppose each other has a polygonal shape that does not include two parallel sides.

9. A communication module comprising a piezoelectric thin film resonator,
    wherein the piezoelectric thin film resonator includes:
    a substrate;
    a lower electrode provided on the substrate;
    a piezoelectric film provided on the lower electrode; and
    an upper electrode provided on the piezoelectric film,
    wherein, at least a portion of the upper electrode and that of the lower electrode oppose each other through the piezoelectric film, and at least a portion of a periphery of the upper electrode sticks out from an upper end portion of the piezoelectric film and has a hood-like shape, and at least the portion of the periphery of the upper electrode sticking out like a hood has a reversely tapered shape extending from an edge, or a location adjacent to the edge, of the piezoelectric film.

10. The communication module according to claim 9, wherein the periphery of the upper electrode is placed so as to coincide with or to be in the vicinity of at least a portion of a periphery of the piezoelectric film.

11. The communication module according to claim 9, wherein an area where the upper electrode and the lower electrode oppose each other has an elliptic shape.

12. The communication module according to claim 9, wherein an area where the upper electrode and the lower electrode oppose each other has a polygonal shape that does not include two parallel sides.

13. A communication device comprising a piezoelectric thin film resonator,
    wherein the piezoelectric thin film resonator includes:
    a substrate;
    a lower electrode provided on the substrate;
    a piezoelectric film provided on the lower electrode; and
    an upper electrode provided on the piezoelectric film,
    wherein, at least a portion of the upper electrode and that of the lower electrode oppose each other through the piezoelectric film, and at least a portion of a periphery of the upper electrode sticks out from an upper end portion of the piezoelectric film and has a hood-like shape, and at least the portion of the periphery of the upper electrode sticking out like a hood has a reversely tapered shape extending from an edge, or a location adjacent to the edge, of the piezoelectric film.

14. The communication device according to claim 13, wherein the periphery of the upper electrode is placed so as to coincide with or to be in the vicinity of at least a portion of a periphery of the piezoelectric film.

15. The communication device according to claim 13, wherein an area where the upper electrode and the lower electrode oppose each other has an elliptic shape.

16. The communication device according to claim 13, wherein an area where the upper electrode and the lower electrode oppose each other has a polygonal shape that does not include two parallel sides.

\* \* \* \* \*